(12) United States Patent
Ohba

(10) Patent No.: US 10,137,702 B2
(45) Date of Patent: Nov. 27, 2018

(54) TREATMENT LIQUID APPLICATOR AND PRINTER INCLUDING SAME

(71) Applicant: Tetsuya Ohba, Kanagawa (JP)

(72) Inventor: Tetsuya Ohba, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 15/627,654

(22) Filed: Jun. 20, 2017

(65) Prior Publication Data

US 2018/0001671 A1 Jan. 4, 2018

(30) Foreign Application Priority Data

Jul. 1, 2016 (JP) ................................ 2016-131345
Apr. 24, 2017 (JP) ................................ 2017-085357

(51) Int. Cl.
*B41J 11/00* (2006.01)
*C23C 14/22* (2006.01)

(52) U.S. Cl.
CPC ........... *B41J 11/0015* (2013.01); *C23C 14/22* (2013.01)

(58) Field of Classification Search
CPC ...... B41J 11/0005; B41J 11/04; B41J 11/0015
See application file for complete search history.

(56) References Cited

U.S. PATENT DOCUMENTS

| 2011/0310166 A1* | 12/2011 | Namba ................ B41J 2/17513 347/21 |
| 2012/0262519 A1 | 10/2012 | Hoshino et al. |
| 2015/0022600 A1 | 1/2015 | Numata |
| 2016/0167401 A1 | 6/2016 | Ebihara et al. |

FOREIGN PATENT DOCUMENTS

| JP | 2004-130614 | 4/2004 |
| JP | 2012-218229 | 11/2012 |
| JP | 2012-218374 | 11/2012 |
| JP | 2014-019028 | 2/2014 |
| JP | 2014-100805 | 6/2014 |
| JP | 2015-013387 | 1/2015 |
| JP | 2015-020390 | 2/2015 |
| JP | 2015-020391 | 2/2015 |
| JP | 2015-120096 | 7/2015 |
| JP | 2015-229300 | 12/2015 |
| JP | 2016-045083 | 4/2016 |
| JP | 2016-117728 | 6/2016 |

\* cited by examiner

*Primary Examiner* — Lamson Nguyen
(74) *Attorney, Agent, or Firm* — Cooper & Dunham LLP

(57) ABSTRACT

A treatment liquid applicator includes a storage container and an outlet. The storage container stores a treatment liquid. The outlet is disposed at the storage container. The outlet includes an outlet opening through which the treatment liquid flows from the storage container to an outside of the storage container. The outlet extends from an inner wall surface of the storage container.

27 Claims, 9 Drawing Sheets

COMPARATIVE
EXAMPLE

COMPARATIVE
EXAMPLE

TREATMENT LIQUID APPLICATOR AND PRINTER INCLUDING SAME

CROSS-REFERENCE TO RELATED APPLICATIONS

The present application claims priority pursuant to 35 U.S.C. § 119(a) from Japanese patent application Nos. 2016-131345 and 2017-085357, filed on Jul. 1, 2016 and Apr. 24, 2017, respectively, the entire disclosure of each of which is incorporated by reference herein.

BACKGROUND

Technical Field

Aspects of the present disclosure relate to a treatment liquid applicator and a printing apparatus incorporating the applicator.

Related Art

Printing apparatuses may apply a treatment liquid, such as a beading inhibitor, to restrict beading, in which adjacent liquid droplets mix.

SUMMARY

In one aspect of the disclosure, a treatment liquid applicator includes a storage container and an outlet. The storage container stores a treatment liquid. The outlet is disposed at the storage container. The outlet includes an outlet opening through which the treatment liquid flows from the storage container to an outside of the storage container. The outlet extends from an inner wall surface or the storage container.

In another aspect of the disclosure, a printing apparatus includes a treatment liquid applicator. The printing apparatus includes a storage container and an outlet. The storage container stores a treatment liquid. The outlet is disposed at the storage container. The outlet includes an outlet opening through which the treatment liquid flows from the storage container to an outside of the storage container. The outlet extends from an inner wall surface of the storage container.

BRIEF DESCRIPTION OF THE DRAWINGS

The aforementioned and other aspects, features, and advantages of the present disclosure would be better understood by reference to the following detailed description when considered in connection with the accompanying drawings, wherein.

Figure 1:
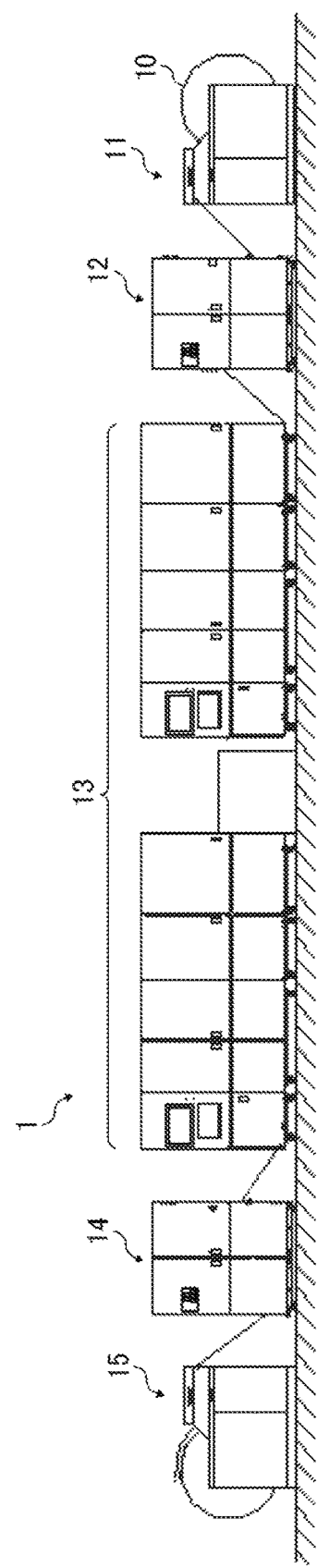
FIG. 1 is an illustration of an overall configuration of a printing apparatus including a treatment liquid applicator according to an embodiment of the present disclosure.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

The terminology used herein is for the purpose of describing particular embodiments only and is not intended to be limiting of the present invention. As used herein, the singular forms "a", "an" and "the" are intended to include the plural forms as well, unless the context clearly indicates otherwise.

In describing embodiments illustrated in the drawings, specific terminology is employed for the sake of clarity. However the disclosure of this patent specification is not intended to be limited to the specific terminology so selected and it is to be understood that each specific element includes all technical equivalents that operate in a similar manner and achieve similar results.

Although the embodiments are described with technical limitations with reference to the attached drawings, such description is not intended to limit the scope of the disclosure and all of the components or elements described in the embodiments of this disclosure are not necessarily indispensable.

Hereinafter, embodiments of the present disclosure are described with reference to accompanying drawings. A printing apparatus 1 including a treatment liquid applicator 12 according to an embodiment of the present disclosure is described with reference to FIG. 1. FIG. 1 is an illustration of an overall configuration of the printing apparatus 1.

In the printing apparatus 1, a continuous sheet of paper 10 (hereinafter, continuous sheet 10) as a long-size, continuous roll of recording medium is fed from a feeding device 11 and the treatment liquid applicator 12 according to the present embodiment applies a treatment liquid onto the continuous sheet 10.

Then, a printing section 13 performs a printing process on the continuous sheet 10 and feeds the continuous sheet 10 to a dryer 14. The continuous sheet 10 is subjected to heating and cooling processes by the dryer 14 and wound by a winder 15.

Figure 2:
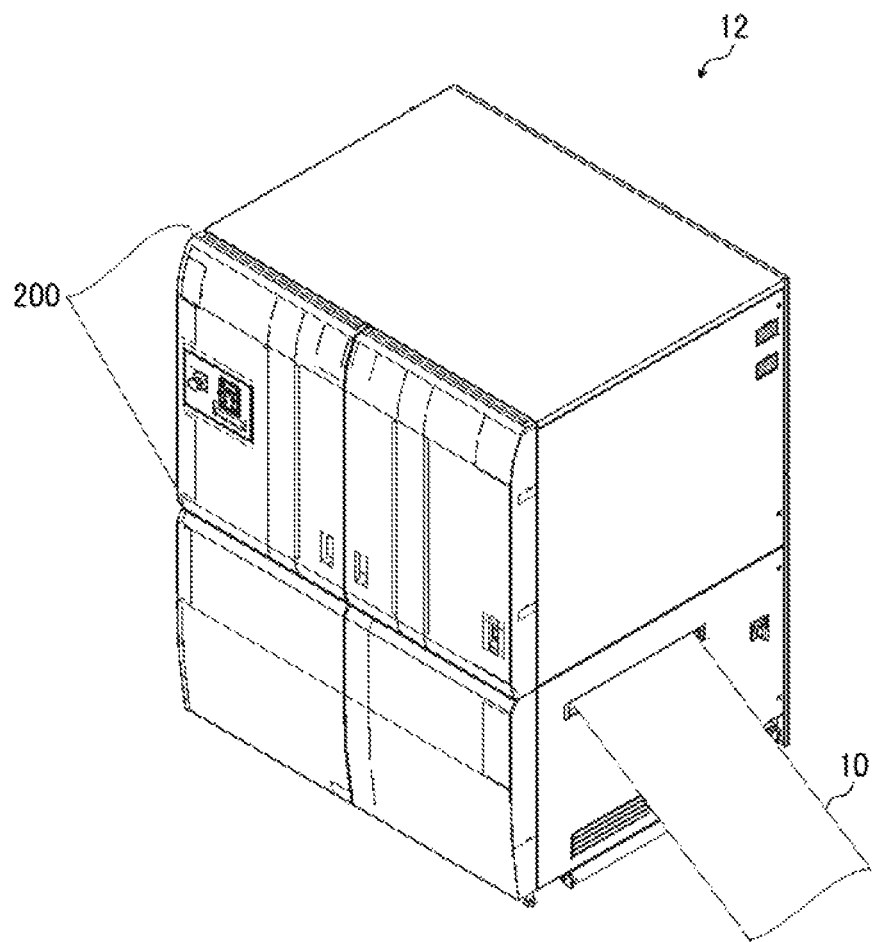
FIG. 2 is an external perspective view of a treatment liquid applicator according to a first embodiment of the present disclosure.

Next, the treatment liquid applicator 12 according to the first embodiment of the present disclosure is described with reference to FIGS. 2 and 3. FIG. 2 is an external perspective view of the treatment liquid applicator 12 and FIG. 3 is a schematic view of a configuration of the treatment liquid applicator 12.

The treatment liquid applicator 12 includes a coating section 200, a reservoir tank 224, and cartridges 229 and 238. The coating section coats a treatment liquid 20, such as a beading inhibitor, to the continuous sheet 10 as a print medium. The reservoir tank 224 is a supply unit to supply the treatment liquid 20 to the coating section 200. The present embodiment is described with an example in which the target onto which the treatment liquid is applied is a continuous printing medium. However, the target is not limited to such a continuous print medium.

The coating section 200 includes a coating roller 201 to coat the treatment liquid 20 on the continuous sheet 10; a squeeze roller 202 to supply the treatment liquid 20 to the coating roller 201 and form the supplied liquid into a thin film; and a pressure roller 203 to sandwich the continuous sheet 10 between the coating roller 201 and the pressure roller 203.

Figure 3:
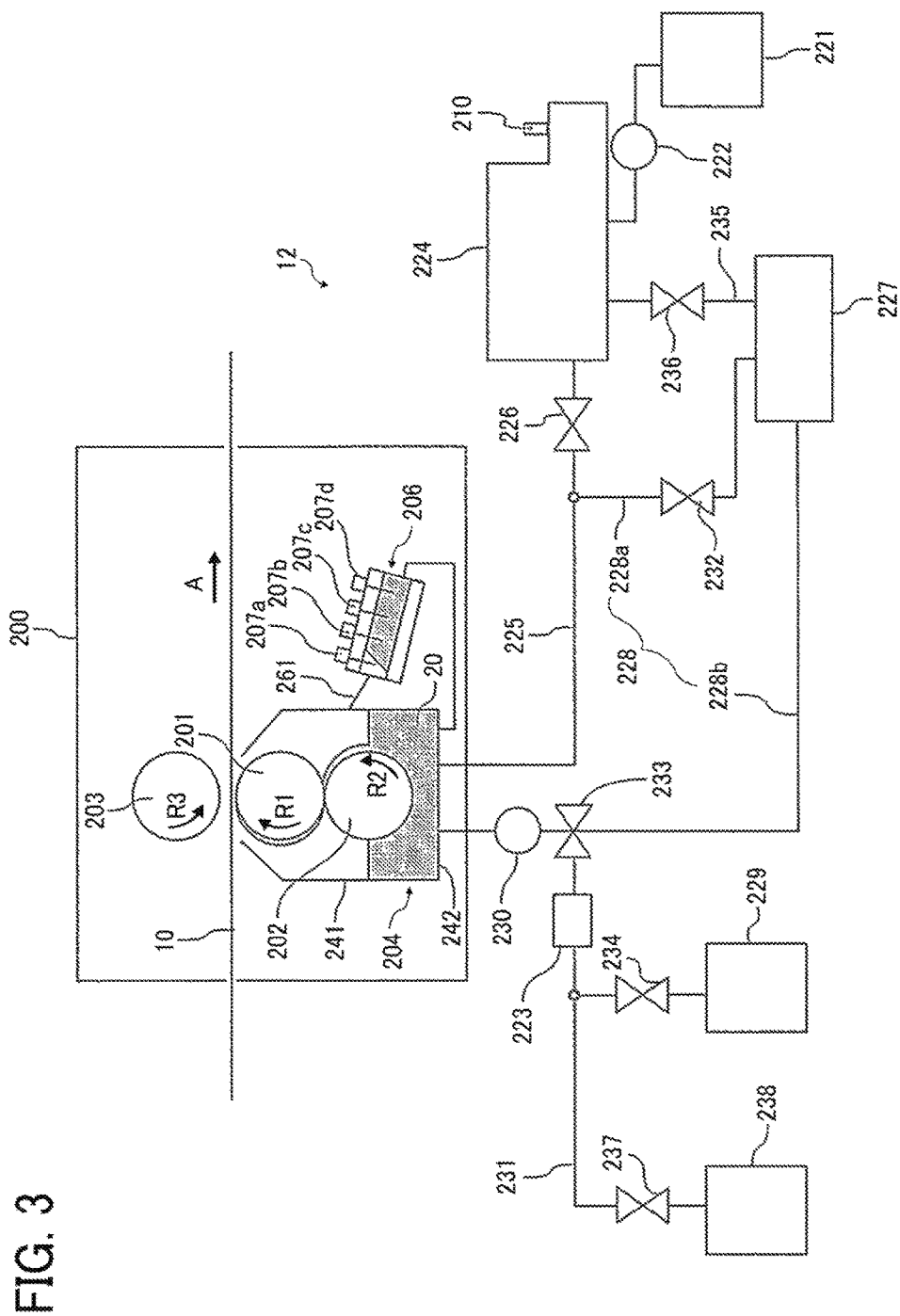
FIG. 3 is an illustration of a configuration of the treatment liquid applicator according to the first embodiment of the present disclosure.

Herein, the coating roller 201, the squeeze roller 202, and the pressure roller 203 rotate in directions indicated by arrows R1, R2, and R3, respectively, in FIG. 3. The continuous sheet 10 is conveyed in a direction indicated by arrow A in FIG. 3.

The coating section 200 further includes a storage container 204 and a liquid surface sensor 206. In the present embodiment, the storage container 204 is a supply pan to store the treatment liquid 20. The squeeze roller 202 is partially immersed in the treatment liquid 20 in the storage container 204. When the treatment liquid 20 flows from the storage container 204 into the liquid surface sensor 206, the liquid surface sensor 206 detects the surface of the treatment liquid 20 and therefore the amount of liquid inside the storage container 204. The amount or volume of liquid is then adjusted or controlled based on readings from the liquid surface sensor 206, so that the coating amount is kept constant.

The liquid surface sensor 206 includes a plurality of electrode pins 207a, 207b, 207c, and 207d (collectively, 207), and the amount of the treatment liquid 20 remaining inside the storage container 204 is detected with an electrical current that flows when the voltage is applied between the electrode pins 207. Note that the number of electrode pins 207 need only be at least two.

The storage container 204 is formed to cover the coating roller 201 thereby restricting evaporation of the treatment liquid 30 inside the storage container 204.

The storage container 204 is connected to the substantially sealed reservoir tank 224 via a retreat path 225. A solenoid valve 226 is disposed on the retreat path 225 that connects the reservoir tank 224 to the storage container 204. When the solenoid valve 226 is opened, the treatment liquid 20 inside the storage container 204 flows from the storage container 204 to the reservoir tank 224 through the retreat path 225 due to a liquid head difference. With this structure, during standby, the treatment liquid 20 inside the storage container 204 is transferred to the reservoir tank 224 to prevent the viscosity of the liquid from increasing.

The solenoid valve 226 is opened, for example, when a printing process is suspended for an extended period of time (for example, one hour or more) that is longer than the usual work time between normal print jobs, such as replacement of the continuous sheet 10 or a change of the printing pattern. Such a configuration can prevent a down tune, during which the treatment liquid 20 is replenished into the storage container 204 from occurring each time printing is suspended.

The solenoid valve 226 is also opened when power is not supplied. Accordingly, when the power supply of the treatment liquid applicator 12 is shut off, the treatment liquid 20 stored in the storage container 204 is transferred to the reservoir tank 224. Such a configuration can prevent the treatment liquid 20 from being stored without being used for a long time in the storage container 204.

When the treatment liquid 20 in the reservoir tank 224 has not been used for a long time (for example, several weeks or more), the viscosity of the treatment liquid 20 would increase. Hence, when the treatment liquid 20 is not used for a certain time or more, a waste liquid pump 222 sends the treatment liquid 20 in the reservoir tank 224 into a waste tank 221, so that the freshness of the treatment liquid 20 is maintained.

The treatment liquid applicator 12 further includes a circulation path 228 diverging from the retreat path 225. The circulation path 228 includes an upstream circulation path 228a that connects the retreat path 225 to a filter 227 and a downstream circulation path 228b that connects the filter 227 to a three-way valve 233. A solenoid valve 232 is disposed upstream of the filter 227 an the upstream circulation path 228a.

The filter 227 removes paper dust and other foreign matter remaining inside the storage container 204, to prevent the treatment liquid 20 from becoming sticky. Such paper dust and other foreign matter remaining inside the storage container 204 is generated when the continuous sheet 10 slides and moves between the coating roller 201 and the pressure roller 203.

When the treatment liquid 20 is coated on the continuous sheet 10 in the coating section 200, the solenoid valve 232 is properly opened. As a result, some of the treatment liquid 20 inside the storage container 204 is transferred from the retreat path 225 to the filter 227 via the upstream circulation path 228a, and the paper dust and other foreign matter included in the treatment liquid 20 are removed.

When the supply pump 230 is driven with the filter 227 and the storage container 204 connected via the three-way valve 233, the supply pump 230 refills the treatment liquid 20, from which paper dust and other foreign matter have been removed by the filter 227, into the storage container 204.

The supply of the treatment liquid 20 to the storage container 204 is performed from the reservoir tank 224 or from the cartridges 229 and 238, each of which serves as a supply section.

A sensor 210 to detect the amount of treatment liquid 20 remaining in the reservoir tank 224 is disposed on the reservoir tank 224.

When the sensor 210 detects that the remaining amount of the treatment liquid 20 in the reservoir tank 224 is a predetermined amount or more, a solenoid valve 236 is released. When the solenoid valve 236 is released, the treatment liquid 20 stored in the reservoir tank 224 passes through the filter 227 from a circulation supply path 235 that connects the reservoir tank 224 to the filter 227.

When the filter 227 and the storage container 204 are connected vie the three-way valve 233, the supply pump 230 is driven to supply the beading inhibitor, which has passed through the filter 227, to the storage container 204.

By contrast, when the sensor 210 detects that the remaining amount of the treatment liquid 20 in the reservoir tank 224 is less than the predetermined amount, the treatment liquid 20 is supplied from either the cartridge 229 or the cartridge 238.

For example, when the treatment liquid 20 is supplied from the cartridge 229, the solenoid valve 234 is released. With the cartridge 229 and the storage container 204 connected via the three-way valve, the supply pump 230 is driven. The supply pump 230 supplies the treatment liquid 20 in the cartridge 229 to the storage container 204 via a path 231.

In addition, a remaining amount sensor 223 is disposed on the path 231, to detect whether the treatment liquid 20 remains inside the cartridges 229 and 238.

For example, when the remaining amount sensor 223 detects that there is no treatment liquid 20 in the cartridge 229, the control process is switched to supply the treatment liquid 20 from the cartridge 238. With such a configuration, the solenoid valve 237 is released, and the supply pump 230 supplies the treatment liquid 20 from the cartridge 238 to the storage container 204 via the path 231.

When the cartridge 229 reaches an end state of treatment liquid, the cartridge 229 is replaced with a new cartridge 229. A plurality of cartridges is mountable in the above-described manner, thus allowing replacement of the cartridge without suspending operation of the treatment liquid applicator 12. The present embodiment is described with an example of the configuration in which the two cartridges 229 and 238 are mounted. However, in some embodiments, three or more cartridges may be mounted in the treatment liquid applicator 12.

Figure 4:
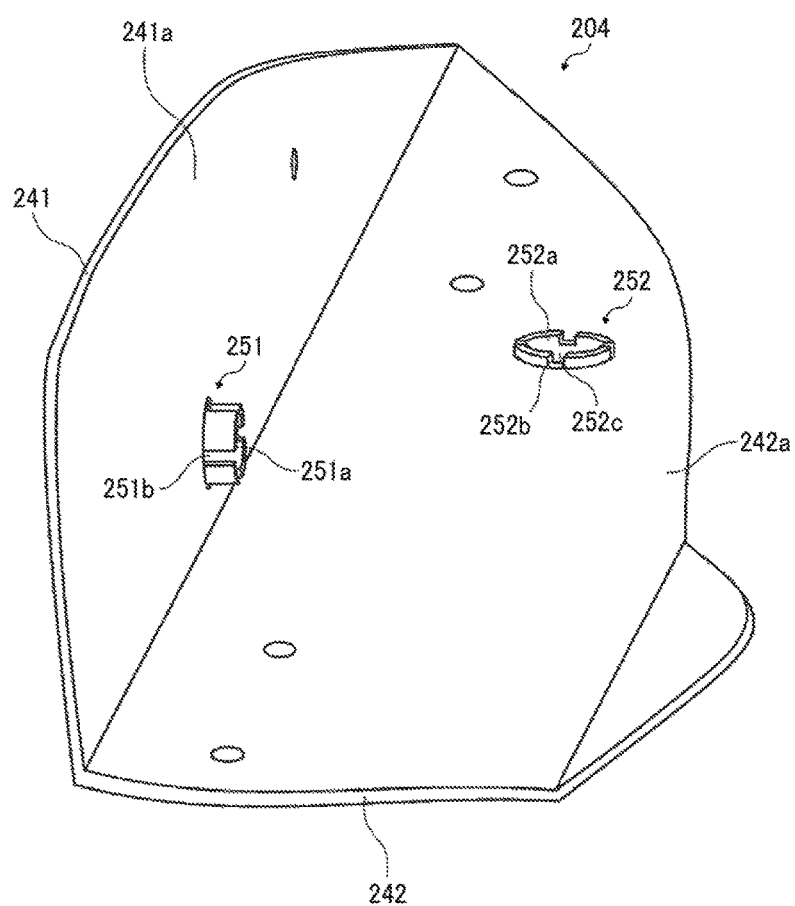
FIG. 4 is a cross-sectional perspective view of a storage container of the treatment liquid applicator according to the first embodiment of the present disclosure.
Figure 5:
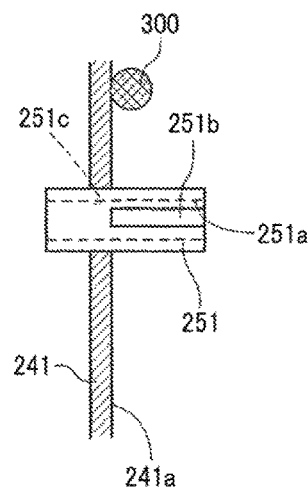
FIG. 5 is a cross-sectional side view of a first outlet on a side wall of the storage container according to the first embodiment of the present disclosure.

Next, the storage container according to a first embodiment of the present disclosure is described with reference to FIGS. 4 and 5. FIG. 4 is a cross-sectional perspective view of the storage container according to the first embodiment. FIG. 5 is a cross-sectional side view of a first outlet on a side wall of the storage container.

The storage container 204 includes a side wall 241 and a bottom 242.

A first outlet 251 having an outlet opening 251a to send the treatment liquid 20 to the external liquid surface sensor 206 is disposed on the side wall 241 of the storage container 204. A pipe 261 (see FIG. 3) connected to the liquid surface sensor 206 is connected to the first outlet 251.

The first outlet 251 extends from an inner wall surface 241a of the side wall 241 being an inner wall surface of the storage container 204. That is, the periphery of the outlet opening 251a is surrounded by the first outlet 251 being a rising portion rising from the inner wall surface 241a of the side wall 241. In other words, the first outlet 251 protrudes from the inner wall surface 241a of the side wall 241 being an inner wall surface of the storage container 204 to the inside of the storage container 204.

As described above, the first outlet 251 extends from the inner wall surface 241a, thus preventing foreign matter in the treatment liquid 20 from easily entering the outlet opening 251a.

That is, as illustrated in FIG. 5, when foreign matter 300 moves to the inner wall surface 241a of the side wall 241, the foreign matter 300 moves toward the first outlet 251 due to a flow of the treatment liquid 20 that flows from the first outlet 251. In such a case, the structure of the first outlet 251 extending, from the inner wall surface 241a of the side wall 241 can prevent the outlet opening 251a of a leading end of the first outlet 251 from being clogged by the foreign matter 300.

Accordingly, the flow (transfer) of the treatment liquid 20 to the liquid surface sensor 206 is stably performed, thus allowing stable liquid surface detection.

The first outlet 251 further includes grooves 251b at a side wall of the first outlet 251. The grooves 251b are opening portions communicated with an inner channel 251c of the first outlet 251 and disposed at one or more places around the periphery of the first outlet 251. In this embodiment, the opening portions are in the form of groove. However, in some embodiments, the opening portions may be in the form of through-hole, instead of the grooves 251b.

With this structure, even when the outlet opening 251a of the leading end of the first outlet 251 is clogged with foreign matter, the treatment liquid 20 can enter the inner channel 251c of the first outlet 251 via the grooves 251b on the side wall.

That is, even when the outlet opening 251a of the first outlet 251 is clogged by the floating foreign matter 300, the treatment liquid 20 can be flown into the first outlet 251 from the grooves 251b on the side wall, thus allowing the treatment liquid 20 to stably flow to the outside.

In addition, a second outlet 252 having an outlet opening 252a through which the treatment liquid 20 flows to the external reservoir tank 224 is disposed on the bottom 242 of the storage container 204. A pipe to form the retreat path 225 that connects to the reservoir tank 224 is connected to the second outlet 252.

The second outlet 252 extends from a bottom surface 242a of the bottom 242 being an inner wall surface of the storage container 204. That is, a peripheral portion of the outlet opening 252a is surrounded by the second outlet 252, being a rising portion rising from the bottom surface 242a of the bottom 242. In other words, the second outlet 252 protrudes from the bottom surface 242a of the bottom 242 being an inner wall surface of the storage container 204 toward the inside of the storage container 204.

As described above, the second outlet 252 extending from the inner wall can prevent the foreign matter in the treatment liquid 20 from easily entering the outlet opening 252a of the second outlet 252.

That is, when the above-described foreign matter 300 falls to the bottom surface due to its own weight, the foreign matter 300 moves toward the second outlet 252 due to the flow of the treatment liquid 20 flowing from the second outlet 252. However, the structure of the second outlet 252 extending from the bottom surface can prevent the outlet opening 252a from being clogged with the foreign matter 300.

The second outlet 252 includes grooves 252b at one or more places of a side wall around the periphery of the second outlet 252. The grooves 252b are opening portions communicated with an inner side of the second outlet 252. In this embodiment, the opening portions are in the form of groove. However, in some embodiments, the opening portions may be in the form of through-hole, instead of the grooves 252b.

With this structure, even when the outlet opening 252a of the leading end of the second outlet 252 is clogged with foreign matter, the treatment liquid 20 can enter the second outlet 252 via the grooves 252b on the side wall.

That is, even when the outlet opening 252a of the second outlet 252 is clogged from above by the foreign matter 300 that floats and drops, the treatment liquid 20 flows into the second outlet 252 via the grooves 252b on the side wall to flow from the storage container 204, thus allowing stable outflow of the treatment liquid 20.

Figure 6:
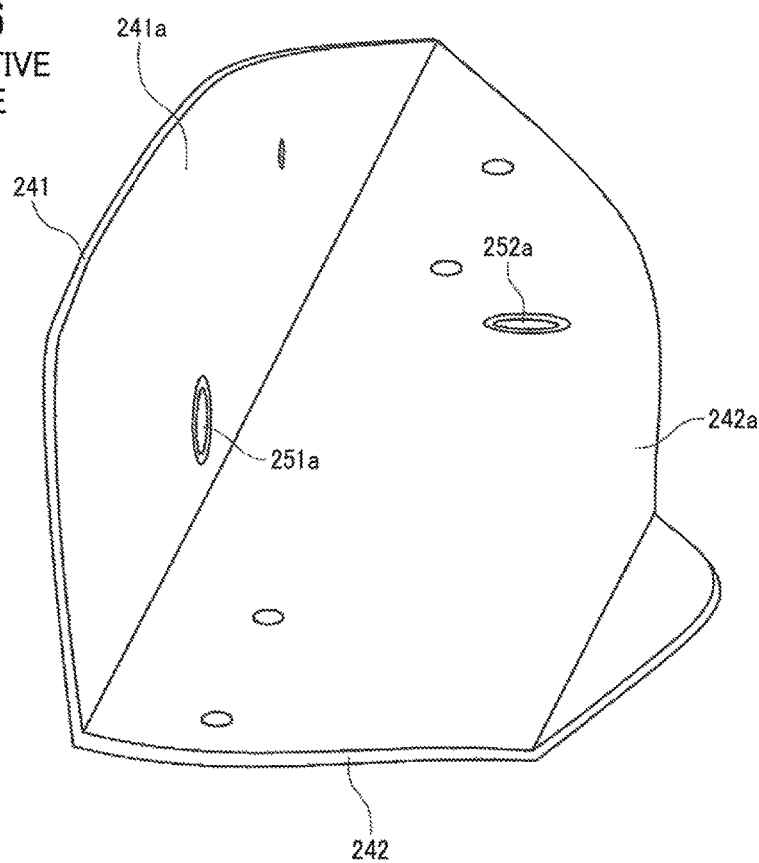
FIG. 6 is a cross-sectional perspective view of a storage container according to a comparative example.
Figure 7:
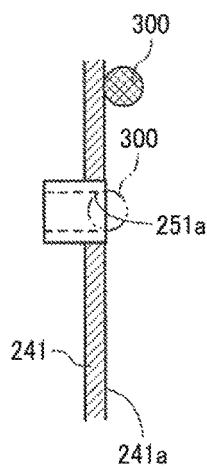
FIG. 7 is a cross-sectional side view of an outlet on a side wall of the storage container according to the comparative example.

Next, a storage container according to a comparative example is described with reference to FIGS. 6 and 7. FIG. 6 is a cross-sectional perspective view of the storage container according to a comparative example. FIG. 7 is a cross-sectional side view of an outlet on the side wall of the storage container.

In the present comparative example, the outlet opening 251a is disposed on the inner wall surface 241a of the side wall 241 of the storage container 204. The outlet opening 251a is disposed on the same plane as a plane on which the inner wall surface 241a of the side wall 241 disposed.

Accordingly, the foreign matter 300 included in the treatment liquid 20 adheres to the inner wall surface 241a of the side wall 241. When the foreign matter 300 moves toward the outlet opening 251a due to a flow of the treatment liquid 20 directing to the outlet opening 251a, the foreign matter 300 easily enters and clog the outlet opening 251a.

The outlet opening 252a is disposed on the bottom surface 242a of the bottom 242 of the storage container 204, and the outlet opening 252a is disposed on the same plane as a plane on which the bottom surface 242a of the bottom 242 is disposed.

Accordingly, when the foreign matter 300 in the treatment liquid 20 falls, the foreign matter 300 is easily drawn into the outlet opening 252a due to the flow of the treatment liquid 20 flown from the outlet opening 252a, and the outlet opening 252a is clogged by the foreign matter 300.

Figure 8:
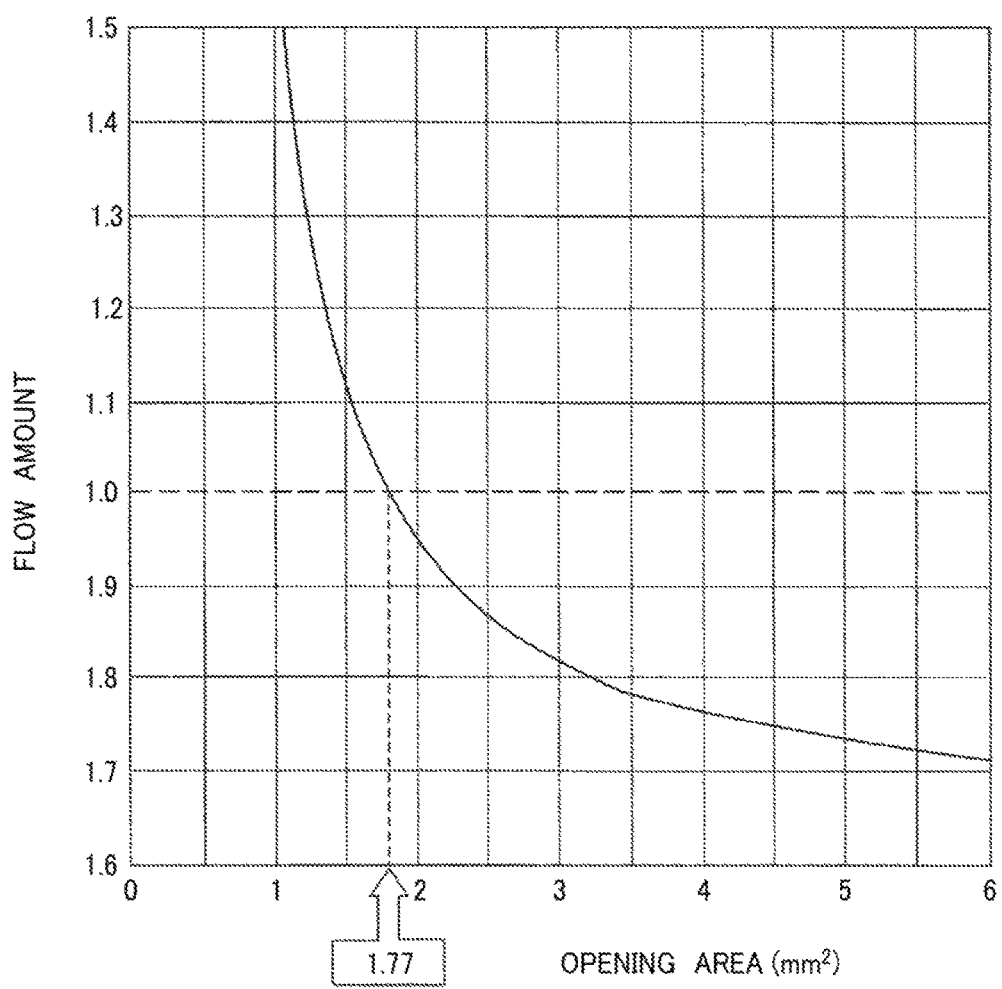
FIG. 8 is a graph of the area, of an opening portion of the first outlet.

Next, the area of an opening portion of the first outlet is described with reference to FIG. 8. FIG. 8 is a graph that illustrates a relation between the opening area of the outlet opening of the first outlet and a supplied liquid amount when the treatment liquid is supplied to the storage container.

FIG. 8 presents a result of measurement of the liquid amount in the storage container 204 when the treatment liquid 20 with a viscosity of 30 mPa·s is supplied to the storage container 204, the opening area of the outlet opening 251a of the first outlet 251 is varied, and the liquid surface sensor 206 reacts.

If the flow amount of the liquid output from the outlet opening 251a is small compared to the amount of the treatment liquid 20 to be supplied to the storage container 204, the amount of the treatment liquid 20 inside the storage container 204 increases, resulting in overflow of the treatment liquid 20.

For example, in the case illustrated in FIG. 8, assume that the flow amount (or an allowable limit) of the treatment liquid 20 that does not overflow is set to "1". In this case, when the opening area of the outlet opening 251a of the first outlet 251 is less than 1.77 mm$^2$, the now amount becomes less than the supplied amount and exceeds the allowable limit.

Accordingly, the opening area of the grooves 251b, which are opening portions disposed at the side wall of the first outlet 251, is preferably equal to or greater than the opening area of the outlet opening 251a.

With this structure, even if the outlet opening 251a of the first outlet 251 is completely clogged with the foreign matter, an overflow of the storage container 204 can be prevented.

In the example illustrated in FIG. 8, the opening area of the grooves 251b as opening portions disposed at the side wall of the first outlet 251 is preferably equal to or greater than 1.77 mm$^2$.

Figure 9:
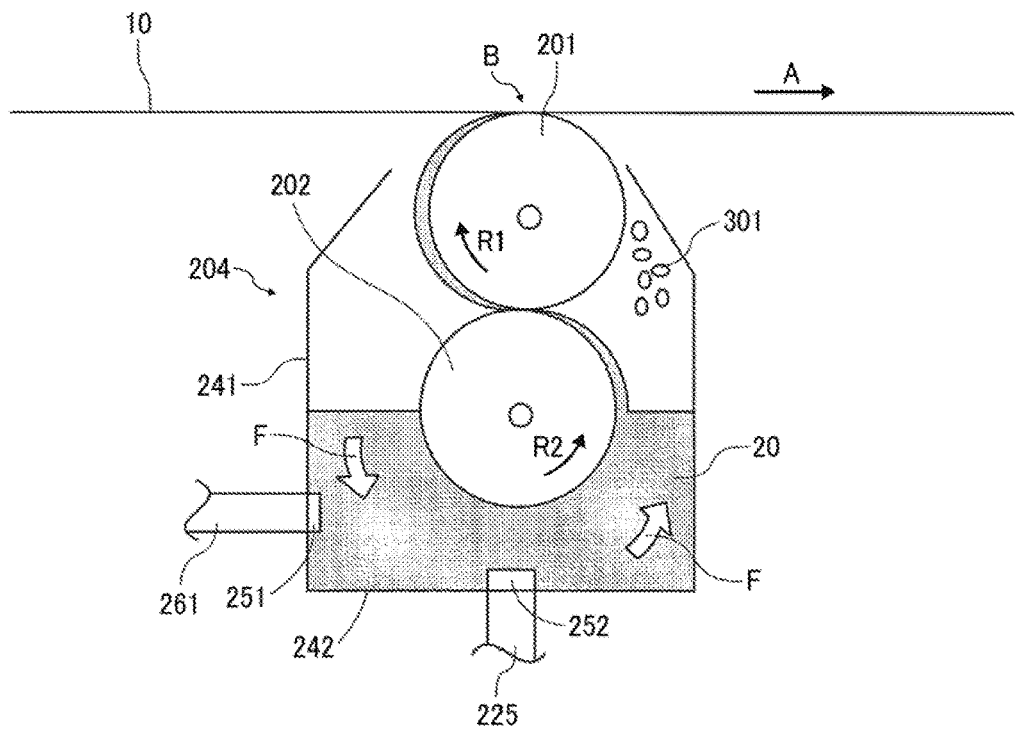
FIG. 9 is a schematic view of a part of the treatment liquid applicator according to a second embodiment of the present disclosure.
Figure 10:
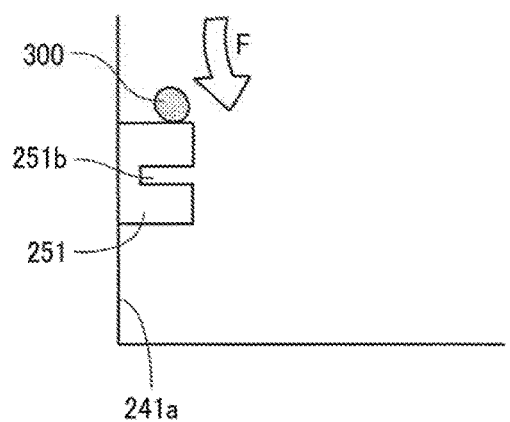
FIG. 10 is a side view of the first outlet of the storage container according to the second embodiment of the present disclosure.
Figure 11:
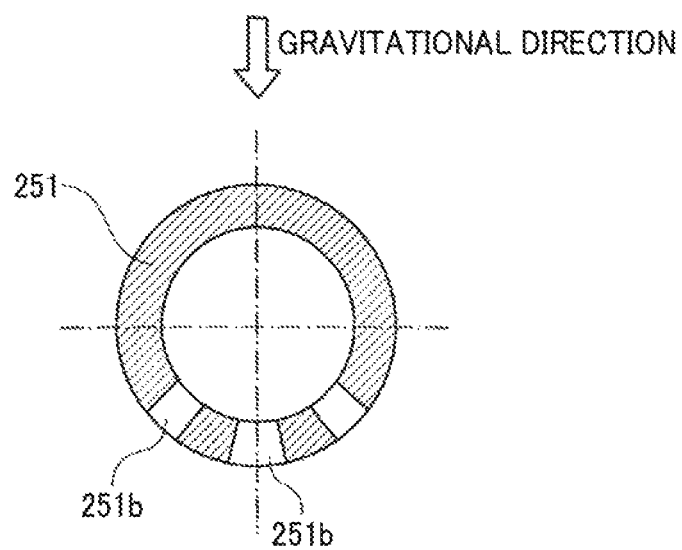
FIG. 11 is a cross-sectional front view of the first outlet of the storage container according to the second embodiment of the present disclosure.
Figure 12:
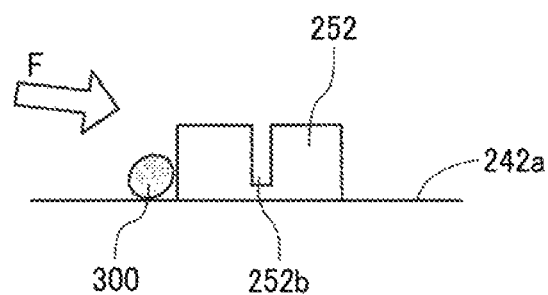
FIG. 12 is a side view of a second outlet of the storage container according to the second embodiment of the present disclosure.
Figure 13:
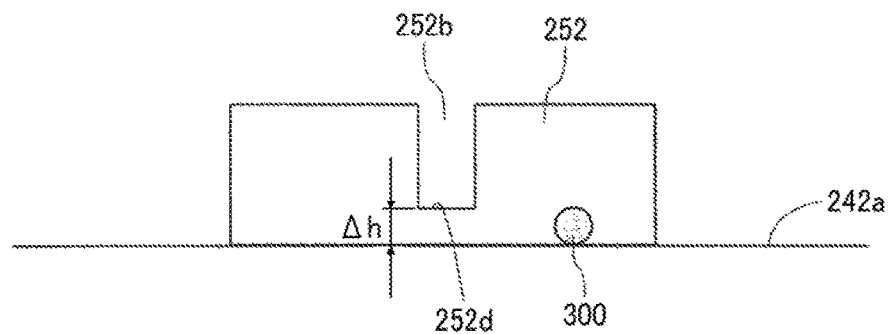
FIG. 13 is a side view illustrating the height of an opening portion of the second outlet of the storage container according to the second embodiment of the present disclosure.

Next, the treatment liquid applicator according to a second embodiment of the present disclosure is described with reference to FIGS. 9 to 13. FIG. 9 is a schematic view of a part of the treatment liquid applicator according to the second embodiment. FIG. 10 is a side view of the first outlet of the storage container in the second embodiment. FIG. 11 is a cross-sectional front view of the first outlet of the storage container. FIG. 12 is a side view of a second outlet of the storage container. FIG. 13 is a side view illustrating the height of an opening portion of the second outlet of the storage container.

The coating roller 201 and the squeeze roller 202 of the storage container rotate in directions indicated by arrows R1 and R2, respectively, similarly with the first embodiment. The continuous sheet 10 is conveyed in a direction indicated by arrow A in FIG. 9.

As illustrated in FIG. 9, the first outlet 251 is disposed upstream of a contact portion B between the continuous sheet 10 and the coating roller 201 in the conveyance direction (indicated by arrow A) of the continuous sheet 10.

The first outlet 251 is disposed such that the grooves 251b, which are opening portions of the first outlet 251, are positioned lower than the center of the first outlet 251 in the gravitational direction as illustrated in FIGS. 10 and 11. In a case when the first outlet 251 is directly formed to the inner wall surface 241a, the grooves 251b are formed at positions lower than the center of the first outlet 251 in the gravitational direction.

Herein, as illustrated in FIG. 9, for example, the rotation of the squeeze roller 202 causes a flow F in the treatment liquid 20 stored in the storage container 204 by.

The direction in which the paper dust 301 generated from the continuous sheet 10 goes depends on the rotary direction of the coating roller 201 and the conveyance direction of the continuous sheet 10. In the present embodiment, the continuous sheet 10 and the coating roller 201 contact each other in a forward direction, in which the conveyance direction and the rotary direction at the contact portion 13 are the same. As a result, more paper dust 301 heads downstream in the conveyance direction of the continuous sheet 10 than at the contact portion B between the continuous sheet 10 and the coating roller 201.

Hence, the first outlet 251 is disposed upstream of the contact portion B between the continuous sheet 10 and the coating roller 201, thus reducing the paper dust 301 being the foreign matter 300 above the first outlet 251. Such a configuration can reduce clogging of the first outlet 251.

In addition, the grooves 251b of the first outlet 251 are disposed downstream of the center of the first outlet 251 in the gravitational direction. Accordingly, when the foreign matter 300 is generated above the first outlet 251 and moves along the flow F, such a configuration can prevent the foreign matter 300 from easily clogging the grooves 251b.

On the other hand, the second outlet 252 is preferably disposed at a position where the flow F flows as horizontally as possible as illustrated in FIG. 12. For this reason, the second outlet 252 vertically overlaps the coating roller 201.

Such a configuration reduces the possibility for the foreign matter 300 to move parallel to the outlet opening 252a, thus preventing the foreign matter 300 from easily clogging the outlet opening 252a. In addition, the coating roller 201 (and the squeeze roller 202) are disposed above the second outlet 252, thus preventing the paper dust 301 from falling onto the second outlet 252 from above.

A lower end 252d of each of the grooves 252b being opening portions of the second outlet 252 is preferably disposed at a position higher than the bottom surface 242a as illustrated in FIG. 13. In other words, the lower end 252d of the groove 252b is preferably positioned at a height away from the bottom surface 242a by a distance Δh.

With this structure, the foreign matter 300 moving along the bottom surface 242a is blocked by a step having the height Δh, thus preventing the grooves 252b from being clogged with the foreign matter 300.

Figure 14:
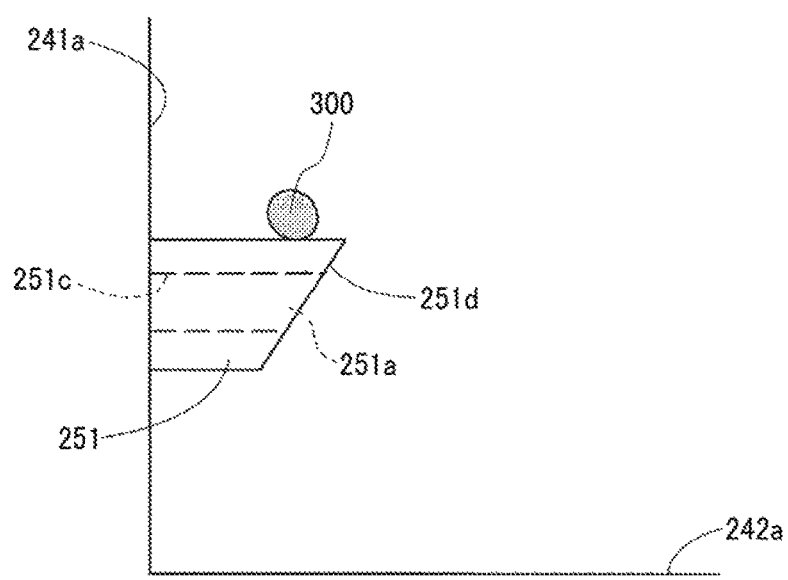
FIG. 14 is a side view of the first outlet of the storage container according to a third embodiment of the present disclosure.

Next, a third embodiment of the present disclosure is described with reference to FIG. 14. FIG. 14 is a side view of the first outlet of the storage container according to the third embodiment.

A leading face 251d including the outlet opening 251a of the first outlet 251 is formed at an oblique angle to the direction in which the treatment liquid 20 flows from the outlet opening 251a to the outside of the storage container 204. The first outlet 251 is disposed with the outlet opening 251a directed toward the bottom 242 of the storage container 204.

As described above, in the present embodiment, the leading face 251d of the first outlet 251 is formed as a slanted surface by obliquely cutting and is directed downwards. Such a configuration covers an area above the inner channel of the first outlet 251 by the wall while increasing the flow amount of the treatment liquid 20, thus preventing the foreign matter 300 from entering from above.

The printing apparatus according to an embodiment of the present disclosure may have, for example, an inkjet structure employing a liquid discharge head. For example, the printing apparatus may be any of a line-type inkjet apparatus and a serial-type inkjet apparatus. Further, the image formation method of the printing apparatus according to an embodiment of the present disclosure is not limited to an inkjet method but may be, e.g., an electrophotographic method.

Numerous additional modifications and variations are possible in light of the above teachings. It is therefore to be understood that, within the scope of the above teachings, the present disclosure may be practiced otherwise than as specifically described herein. With some embodiments baying thus been described, it will be obvious that the same may be varied in many ways. Such variations are not to be regarded as a departure from the scope of the present disclosure and appended claims, and all such modifications are intended to be included within the scope of the present disclosure and appended claims.

What is claimed is:

1. A treatment liquid applicator comprising:
   a storage container to store a treatment liquid;
   a squeeze roller partially immersed in the treatment liquid in the storage container;
   a coating roller disposed opposite the squeeze roller; and
   an outlet disposed at the storage container,
   the outlet including an outlet opening through which the treatment liquid flows from the storage container to an outside of the storage container,
   the outlet extending from an inner wall surface of the storage container,
   wherein the squeeze roller supplies the treatment liquid to the coating roller, to form a film of the treatment liquid on the coating roller.

2. The treatment liquid applicator according to claim 1, wherein the outlet includes an opening portion communicated with an inside of the outlet.

3. The treatment liquid applicator according to claim 2, wherein the outlet is disposed on a side wall of the storage container, and
   wherein the opening portion is disposed at a position lower than a center of the outlet in a gravitational direction.

4. The treatment liquid applicator according to claim 2, wherein the outlet is disposed on a bottom of the storage container, and
   wherein a lower end of the opening portion is disposed at a position higher than the bottom of the storage container in a gravitational direction.

5. The treatment liquid applicator according to claim 2, wherein the opening portion has an opening area equal to or greater than an opening area of the outlet opening.

6. The treatment liquid applicator according to claim 2, wherein the opening portion has an opening area equal to or greater than 1.77 mm$^2$.

7. The treatment liquid applicator according to claim 1, wherein a leading face including the outlet opening of the outlet is slanted with respect to a direction in which the treatment liquid flows from the outlet opening to the outside of the storage container, and
   wherein the outlet is disposed with the outlet opening directed toward a bottom of the storage container.

8. The treatment liquid applicator according to claim 1, wherein the outlet is disposed upstream of a contact portion between a medium and the coating roller in a direction of conveyance of the medium.

9. The treatment liquid applicator according to claim 1, wherein the outlet vertically overlaps the coating roller.

10. A treatment liquid applicator comprising:
    a storage container to store a treatment liquid; and
    an outlet disposed at the storage container and including
       an outlet opening through which the treatment liquid flows from the storage container to an outside of the storage container,
       a protruding portion extending from an inner wall surface of the storage container into an inside of the storage container, and
       an opening portion disposed at a side face of the protruding portion and communicated with an inside of the outlet.

11. The treatment liquid applicator according to claim 10, wherein the outlet is disposed on a side wall of the storage container, and
    wherein the opening portion is disposed at a position lower than a center of the outlet in a gravitational direction.

12. The treatment liquid applicator according to claim 10, wherein the outlet is disposed on a bottom of the storage container, and
    wherein a lower end of the opening portion is disposed at a position higher than the bottom of the storage container in a gravitational direction.

13. The treatment liquid applicator according to claim 10, wherein the opening portion has an opening area equal to or greater than an opening area of the outlet opening.

14. The treatment liquid applicator according to claim 10, wherein the opening portion has an opening area equal to or greater than 1.77 mm$^2$.

15. The treatment liquid applicator according to claim 10, wherein a leading face including the outlet opening of the outlet is slanted with respect to a direction in which the treatment liquid flows from the outlet opening to the outside of the storage container, and
    wherein the outlet is disposed with the outlet opening directed toward a bottom of the storage container.

16. The treatment liquid applicator according to claim 10, further comprising:
    a squeeze roller partially immersed in the treatment liquid in the storage container; and
    a coating roller disposed opposite the squeeze roller, wherein the squeeze roller supplies the treatment liquid to the coating roller, to form a film of the treatment liquid on the coating roller.

17. The treatment liquid applicator according to claim 16, wherein the outlet is disposed upstream of a contact portion between a medium and the coating roller in a direction of conveyance of the medium.

18. The treatment liquid applicator according to claim 16, wherein the outlet vertically overlaps the coating roller.

19. A printing apparatus comprising a treatment liquid applicator, the printing apparatus including:
a storage container to store a treatment liquid;
a squeeze roller partially immersed in the treatment liquid in the storage container;
a coating roller disposed opposite the squeeze roller; and
an outlet disposed at the storage container,
the outlet including an outlet opening through which the treatment liquid flows from the storage container to an outside of the storage container,
wherein the squeeze roller supplies the treatment liquid to the coating roller, to form a film of the treatment liquid on the coating roller.

20. The printing apparatus according to claim 19, wherein the outlet includes an opening portion communicated with an inside of the outlet.

21. The printing apparatus according to claim 20,
wherein the outlet is disposed on a side wall of the storage container, and
wherein the opening portion is disposed at a position lower than a center of the outlet in a gravitational direction.

22. The printing apparatus according to claim 20,
wherein the outlet is disposed on a bottom of the storage container, and
wherein a lower end of the opening portion is disposed at a position higher than the bottom of the storage container in a gravitational direction.

23. The printing apparatus according to claim 20, wherein the opening portion has an opening area equal to or greater than an opening area of the outlet opening.

24. The printing apparatus according to claim 20,
wherein the opening portion has an opening area equal to or greater than 1.77 mm$^2$.

25. The printing apparatus according to claim 19,
wherein a leading face including the outlet opening of the outlet is slanted with respect to a direction in which the treatment liquid flows from the outlet opening to the outside of the storage container, and
wherein the outlet is disposed with the outlet opening directed toward a bottom of the storage container.

26. The printing apparatus according to claim 19, wherein the outlet is disposed upstream of a contact portion between a medium and the coating roller in a direction of conveyance of the medium.

27. The printing apparatus according to claim 19, wherein the outlet vertically overlaps the coating roller.

* * * * *